United States Patent
Rauenbusch et al.

(10) Patent No.: US 10,832,929 B2
(45) Date of Patent: Nov. 10, 2020

(54) WAFER-LIKE SUBSTRATE PROCESSING METHOD AND APPARATUS

(71) Applicant: Atotech Deutschland GmbH, Berlin (DE)

(72) Inventors: Ralph Rauenbusch, Berlin (DE); Tobias Bussenius, Berlin (DE); Daniel Buchberger, Berlin (DE); Ray Weinhold, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 16/326,404

(22) PCT Filed: Sep. 14, 2017

(86) PCT No.: PCT/EP2017/073190
§ 371 (c)(1),
(2) Date: Feb. 19, 2019

(87) PCT Pub. No.: WO2018/068983
PCT Pub. Date: Apr. 19, 2018

(65) Prior Publication Data
US 2019/0341287 A1    Nov. 7, 2019

(30) Foreign Application Priority Data

Oct. 14, 2016    (EP) .................................... 16193990

(51) Int. Cl.
*H01L 21/677*    (2006.01)
*C25F 1/00*    (2006.01)
(Continued)

(52) U.S. Cl.
CPC .......... *H01L 21/67778* (2013.01); *C25F 1/00* (2013.01); *H01L 21/67173* (2013.01); *H01L 21/67769* (2013.01); *H01L 21/6838* (2013.01)

(58) Field of Classification Search
None
See application file for complete search history.

(56) References Cited

U.S. PATENT DOCUMENTS 5,092,729 A *  3/1992  Yamazaki ........... H01L 21/6831
                                                            118/505
5,359,785 A    11/1994  Fukutomi et al.
(Continued)

FOREIGN PATENT DOCUMENTS

CN    101390197    3/2009
CN    106409736    2/2017
(Continued)

OTHER PUBLICATIONS

Search Report for Chinese Patent Application No. 201780051326.9 dated Oct. 8, 2019.
(Continued)

*Primary Examiner* — Charles Capozzi
(74) *Attorney, Agent, or Firm* — Renner, Otto, Boisselle & Sklar, LLP

(57) ABSTRACT

The present invention refers to a method for processing a wafer like substrate using a touching gripper and a touchless gripper. Furthermore, the present invention refers to an apparatus for processing a wafer-like substrate containing a touching gripper and a touchless gripper. Additionally, the present invention refers to the use of an inventive apparatus to process a wafer-like substrate.

5 Claims, 6 Drawing Sheets

(51) Int. Cl.
    *H01L 21/683*    (2006.01)
    *H01L 21/67*    (2006.01)

(56) References Cited

U.S. PATENT DOCUMENTS

| | | | |
|---|---|---|---|
| 9,190,307 | B2 | 11/2015 | Tan et al. |
| 2006/0219257 | A1* | 10/2006 | Sawaki ............ H01L 21/67057 134/1.3 |
| 2008/0080962 | A1* | 4/2008 | Holtmeier ............ B25J 15/0052 414/627 |
| 2009/0169344 | A1* | 7/2009 | Nozawa .................. C23C 16/54 414/221 |
| 2011/0049718 | A1* | 3/2011 | Matsumoto ............. C23C 16/40 257/751 |
| 2011/0263133 | A1 | 10/2011 | Hara et al. |
| 2013/0216348 | A1 | 8/2013 | Tan et al. |

FOREIGN PATENT DOCUMENTS

| | | |
|---|---|---|
| EP | 0999577 | 5/2000 |
| WO | 2016096946 | 6/2016 |

OTHER PUBLICATIONS

PCT/EP2017/073190; PCT International Search Report and Written Opinion of the International Searching Authority dated Dec. 6, 2017.

\* cited by examiner

WAFER-LIKE SUBSTRATE PROCESSING METHOD AND APPARATUS

The present application is a U.S. National Stage Application based on and claiming benefit and priority under 35 U.S.C. § 371 of International Application No. PCT/EP2017/073190, filed 14 Sep. 2017, which in turn claims benefit of and priority to European Application No. 16193990.5 filed 14 Oct. 2016, the entirety of both of which is hereby incorporated herein by reference.

FIELD OF THE INVENTION

The present invention refers to a method and an apparatus for processing a wafer-like substrate. The method and the apparatus are especially suitable for safe and in-place transport of the wafer-like substrate during processing.

BACKGROUND OF THE INVENTION

The usage of grippers to transport wafer-like substrates is known in the art. Herein, different kinds of grippers are used. In the past especially grippers touching the surface or the edge of the substrate have been used. However, also the use of touchless grippers using especially the Bernoulli grip has been well established. Herein, both types of grippers provide specific benefits, but simultaneously provide certain misfits being problematic for sensitive substrate.

Grippers touching the surface of the substrate typically provide the possibility to very exactly handle the substrate. However, the transported substrates tend to provide damages on their surface at the contact points.

Grippers not touching the surface typically avoid such localized damages based on the lack of regular contact points. However, such grippers are more complex and although the substrates are fixed they are able to move to a certain extent. On the one hand they might move to the side based on inertia effects during movement. Using limiting edges to prevent such movement results in the possibility of a collision of the substrate and the limiting edge, possibly damaging the edge of the substrate or even the whole substrate. Furthermore, the movement and vibration of the transported substrate provide the risk of damaging the substrate when it is placed. Placing such substrate in a complex structure like a substrate holder as disclosed in WO 2016/096946 A1 places an even greater burden on such process.

OBJECTIVE OF THE PRESENT INVENTION

Thus, it is a need to provide an improved processing method for wafer-like substrates and an apparatus to realize said method in order to handle the substrate safely and in place during transport.

SUMMARY OF THE INVENTION

The aforementioned problems are solved by the invention as disclosed in the independent claims and the description. Further modifications providing additional benefits are included in the dependent claims and the following description. However, even further benefits not being explicitly stated herein but being immediately derivable or discernible from the connections discussed herein are solved by the present invention and its embodiments disclosed herein.

The present invention refers to a method for processing a wafer-like substrate, comprising the following steps:

i) providing the substrate in a loading device;
ii) transporting the substrate from the loading device to an alignment device using a touchless gripper or a touching gripper;
iii) aligning the substrate in the alignment device;
iv) transporting the aligned substrate to a connecting device using a touching gripper, wherein the connecting device provides a substrate holder;
v) fastening the aligned substrate in the substrate holder in the connecting device;
vi) transporting the substrate holder comprising the aligned substrate further to a treatment device using a touching gripper;
vii) treating the substrate, which is still fastened in the respective substrate holder, in the treatment device;
viii) transporting the substrate holder comprising the treated substrate to the connecting device, wherein the treated substrate is unfastened from the respective substrate holder;
ix) transporting the treated substrate further to a post-treatment device using a touching gripper;
x) post-treating the substrate in the post-treatment device;
xi) transporting the post-treated substrate from the post-treatment device to a storing device using a touchless gripper or back to the loading device using a touchless gripper.

Furthermore, the present invention refers to an apparatus for processing a wafer-like substrate, having a loading device, an alignment device, a connecting device, a treatment device, a post-treatment device, a storing device and a touching gripper and a touchless gripper, both are capable of transporting the substrate in such a way, that:
- a touchless gripper or touching gripper capable of transporting the substrate from the loading device to the alignment device capable of aligning the substrate;
- a touching gripper capable of transporting an aligned substrate from the alignment device to the connecting device capable of fastening the aligned substrate in a substrate holder and unfastening a treated substrate out a substrate holder;
- a touching gripper capable of transporting the substrate holder from the connecting device to the treatment device capable of treating the substrate and back to the connecting device;
- a touching gripper capable of transporting the treated substrate from the connecting device to the post-treatment device;
- a touchless gripper capable of transporting the post-treated substrate from the post-treatment device to the storing device or back to the loading device.

Furthermore, the present invention refers to the use of the inventive method or inventive apparatus for processing a wafer-like substrate providing a frame like structure. Typically, it should be expected that the misfits of the touching gripper and touchless gripper accumulate and provide worse results. However, surprisingly it was noted that such change of the type of gripper at the point of the post-treating resulted in a greatly decreased amount of damages on very sensitive test substrates.

The term "touchless gripper" as used herein refers to a gripper capable of handle a substrate without coming into contact with the surface of the substrate. However, typically it is preferred that such touchless gripper further provides at least one limiting edge. Such limiting edge is able to contact the edge of the substrate, if said substrate is moving away from the centered position of the touchless gripper. Thus, such limiting edge is typically very useful to prevent the substrate from being lost during movement based on, for example, the inertia of the substrate.

The term "touching gripper" as used herein refers to a gripper capable of handle an object while coming into contact with the object. An example of such touching gripper is a touching gripper capable of transporting a substrate while contacting the surface of the substrate. Preferably, such touching gripper contacts the substrate selectively at the exterior part of the substrate like the area representing the most exterior 10% of the substrate surface based on the surface area of the substrate surface. Another example of the touching gripper is a gripper capable of transporting a substrate holder. Such gripper capable of transporting a substrate holder, for example, attaches to some hanging element of the substrate holder to reversibly connect to said substrate holder. Herein, such gripper capable of transporting a substrate holder preferably attaches mechanically to the substrate holder. However, it can also use any other means known to the person skilled in the art to attach itself to such substrate holder like using vacuum suction. Examples of substrate holders providing such hanging element are available, for example, from WO 2016/096946 A1. It appears that the inventive method and apparatus are especially suitable for such substrate holders providing means for fastening as well as electrically contacting the substrate.

If components or features are specified by the terms "capable of" something or "capable to" provide something these terms are considered as limited within the scope of such specified components or features by referring to the function which is to be performed. With other words the components or features are specially adapted to or configured of fulfilling the named function.

BRIEF DESCRIPTION OF THE FIGURES

For a more complete understanding of the present invention, reference is made to the following Detailed Description of the Invention considered in conjunction with the accompanying figures, in which.

DETAILED DESCRIPTION OF THE INVENTION

Figure 1:
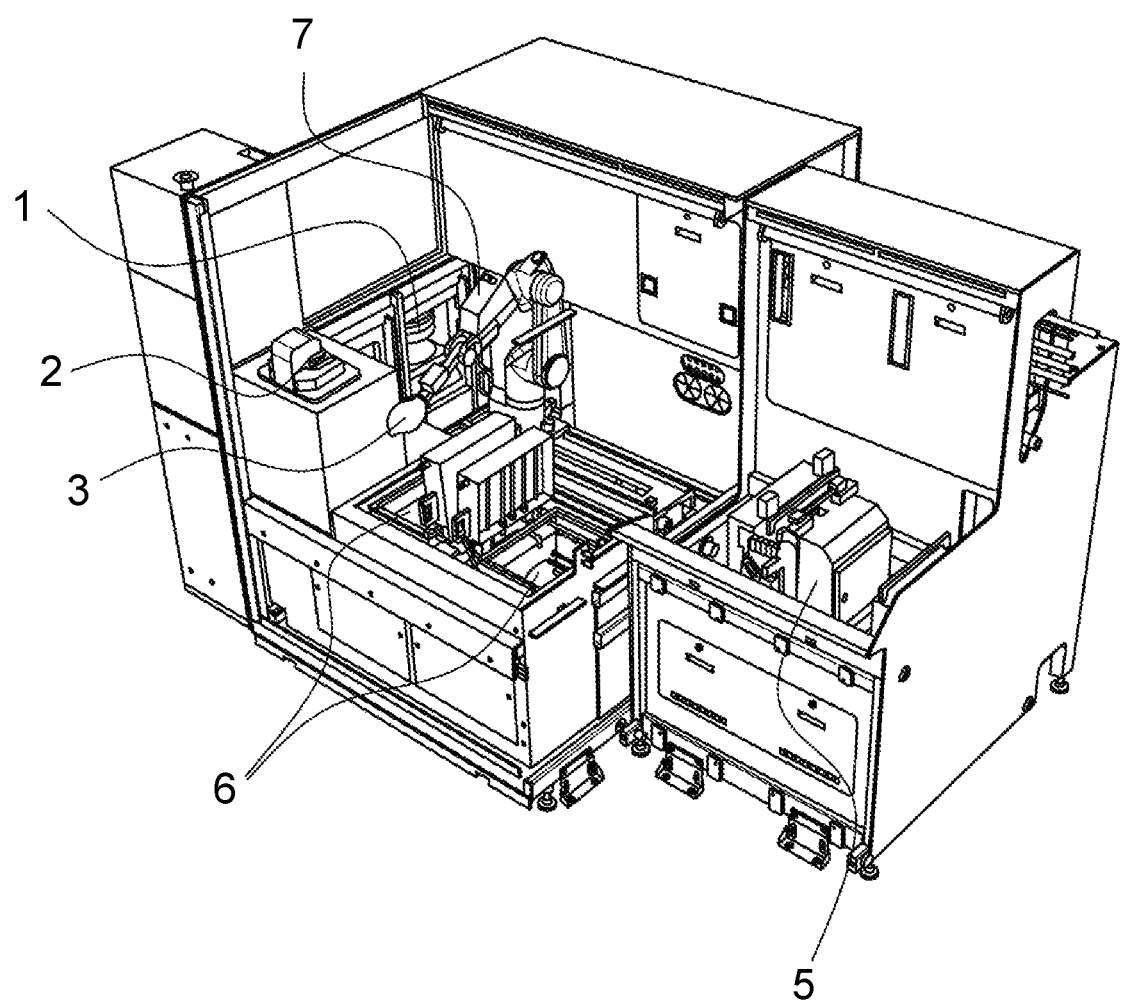
FIG. 1 shows a schematic perspective view of a part of an inventive apparatus.

According to an aspect the present invention refers to a method for processing a wafer-like substrate, comprising the following steps:

i) providing the substrate in a loading device;

ii) transporting the substrate from the loading device to an alignment device using a touchless gripper or a touching gripper;

iii) aligning the substrate in the alignment device;

iv) transporting the aligned substrate to a connecting device using a touching gripper, wherein the connecting device provides a substrate holder;

v) fastening the aligned substrate in the substrate holder in the connecting device;

vi) transporting the substrate holder comprising the aligned substrate further to a treatment device using a touching gripper;

vii) treating the substrate, which is still fastened in the respective substrate holder, in the treatment device;

viii) transporting the substrate holder comprising the treated substrate to the connecting device, wherein the treated substrate is unfastened from the respective substrate holder;

ix) transporting the treated substrate further to a post-treatment device using a touching gripper;

x) post-treating the substrate in the post-treatment device;

xi) transporting the post-treated substrate from the post-treatment device to a storing device using a touchless gripper or back to the loading device using a touchless gripper.

Herein, it has to be noted that, for example, step ii) might include further steps not explicitly mentioned. For example, some inspection of the wafer-like substrate to detect defects before it is transported to the alignment device.

Herein, it has to be understood that the aforementioned method may utilize multiple loading devices, alignment devices, treatment devices, and so on. The aforementioned method proved to be especially useful to process especially sensitive wafer-like substrates. Herein, the aforementioned combination of method steps provides a secure processing of the wafer-like substrates with greatly reduced risk of damages.

A preferred type of a touchless gripper as used herein is a Bernoulli gripper. Such Bernoulli gripper utilizes the Bernoulli grip based on a gas-flow to provide an adhesion force to the substrate while simultaneously avoiding a contact of the surface of the substrate and the Bernoulli gripper.

Examples of treatment devices that can be used in the present invention are treatment device for wet treatment, preferably a) chemical or electrolytic metal deposition, b) chemical or electrolytic etching and/or c) chemical or electrolytic cleaning, more preferably for electrolytic metal deposition, chemical etching and or chemical cleaning. The inventive method proved to be especially useful for a treatment device for chemical or electrolytic metal deposition, more preferred electrolytic metal deposition. An especially preferred type of treatment device as used herein is a treatment device for electrolytic copper deposition, preferably a treatment device for vertical electrolytic copper deposition.

A preferred type of the touching gripper, especially the touching gripper capable of transporting a substrate while contacting the surface of the substrate like used in steps iv) and ix), is a gripper using vacuum suction.

In a preferred embodiment of the invention the touching gripper, especially the touching gripper capable of transporting a substrate while contacting the surface of the substrate, is a gripper using vacuum suction and the touchless gripper is a Bernoulli type gripper. Such grippers proved to be especially useful and reliable for transporting many types of substrates.

A specifically preferred type of touching gripper capable of transporting a substrate while contacting the surface of the substrate is a touching gripper providing at least 3, more preferred at least 4, even more preferred at least 6 nozzles capable of reversibly attach a substrate using a vacuum. These touching grippers proved to be very efficient to transport a previously aligned substrates to a specified position. Preferably, said nozzles are located at elevations of the surface of the touching gripper to reduce the area of contact of the touching gripper and the substrate to a minimum.

The term "connecting device" as used herein refers to a device to fasten the substrate to a substrate holder. Preferably, such connecting device is a firmly attached device within the apparatus. Herein, for example, a substrate holder is introduced into the connecting device and opened. Thereafter, a substrate is placed in the opened substrate holder. Then, the substrate holder is closed and removed from the connecting device. Or, for example, a first part of the substrate holder is introduced into the connecting device. After placing the substrate on said first part of the substrate holder a second part of the substrate holder is reversibly fastened to the first substrate holder part. Preferably, such closing of the substrate holder or reversible fastening of such second substrate holder part is based on a mechanism integrated in the substrate holder like disclosed in WO 2016/096946 A1.

Furthermore, it is preferred that the aligning of the substrate results in an exactly aligned substrate for subsequent treating in said treating device. Such exact aligning provides the possibility to exactly position a substrate in a substrate holder used, for example, for electrolytic metal deposition to ensure a secure electrical contacting. An example of such aligning device is the pre-aligner 1207 from Mechatronic Systemtechnik GmbH, Austria.

Typically the substrate comprises at least one surface to be treated, e.g. two surfaces. During treating and pre-treating the substrate the surface to be treated becomes more and more sensitive and therefore susceptible for damaging during processing the substrate, especially during transport. It is preferred that the touching gripper or the touchless gripper is capable to grip the substrate on its surface to be treated during transport. It proved to be especially useful, if the touching gripper or touchless gripper of steps ii), iv), ix) and xi) is capable to do so.

It was noted that the inventive method and the apparatus can be practised especially space saving using a multifunctional robot arm arranged of being fixed to one or more touching gripper and touchless gripper or reversibly attached to one or more touching gripper or touchless gripper. Preferably a multifunctional robot arm is reversibly attached to a touching gripper or a touchless gripper, wherein the touching gripper and touchless gripper of steps ii), iv), ix) and xi) are reversibly attached to this robot arm. For example, using such multifunctional robot arm the touching gripper used in step ix) can easily be replaced by a touchless gripper to be used in step xi), wherein the same robot arm can be used for both steps.

In a further embodiment of the present invention a multifunctional robot arm is reversibly attached to a touching gripper or a touchless gripper, wherein the touching gripper and touchless gripper of steps ii), iv), ix), vi) and xi) are reversibly attached to this robot arm.

Furthermore, it is preferred in further embodiments of the present invention that the treating of the substrate of step vii) is a treatment of both surfaces of the substrate. Such type of treatment proved to be especially useful, if the treatment contains a metal deposition, preferably an electrolytic metal deposition, on both sides of the substrate. Such substrates seem to provide an increased stability allowing, for example, a faster movement of such substrate apparently being less sensitive to inertia effects and, thus, a further providing a further reduction of the processing time.

In a preferred embodiment of the invention the post-treating contains drying the substrate. Using a touchless gripper after such drying process greatly reduces the damages on the surface of the substrate. It appears that after said drying process the treated surface of the substrate is especially sensitive, while the substrates even after treatment appear to be far less sensitive towards surface damages before said drying process. An example of a drying method that can be used is the Marangoni drying.

Furthermore, it is preferred to include at least one further post-treating, e.g. rinsing, in the post-treating device. For example, it typically proved to be beneficial that the post-treating includes a rinsing and a drying of the substrate. Combining said two steps in the post-treating device allows avoiding a rinsing step of the substrate while being fastened to the substrate holder requiring, for example, significantly greater amounts of cleaning liquid. The term "rinsing" as used herein refers to any cleaning process capable of cleaning the surface of the substrate.

Although, different types of touching grippers or touchless grippers can be used in each step, it was typically preferred that the same touching gripper is used in steps iv) and ix). Using the same touching gripper for this step allows to reduce the number of components and simplifies the required device and maintenance. In some embodiments of the present invention the same touching gripper used in steps ii), iv) and ix), if a touching gripper is used in step ii).

Additionally, it is typically beneficial to utilize a touchless gripper in step ii). Although, the surface of the substrate is not that sensitive at this point using such touchless gripper still seems to provide some further improvement for many substrates.

A further reduction of the number of components and simplification of the device and maintenance can be typically achieved using the same touchless gripper in steps ii) and xi). It was noted that the same type of touchless gripper can be advantageously used in both steps of the method.

Furthermore, it proved to be further advantageous to use a touchless gripper or a touching gripper as explained above, preferably a touching gripper capable of transporting a substrate while contacting the surface of the substrate, wherein said touchless gripper or touching gripper is a double sided gripper capable of transporting a substrate on each side of the double sided gripper. It proved to be especially useful to utilize such touchless gripper or touching gripper in at least one step selected from the group consisting of steps ii), iv), ix), more preferred selected from the group consisting of steps iv) or ix). Especially, it was preferred to utilize a touching gripper, preferably the same touching gripper, in step iv) and ix). It was noted that utilizing such touchless gripper or touching gripper, preferably a touching gripper capable of transporting a substrate while contacting the surface of the substrate, allows to further shorten the processing time of the substrate, as it allows to reversibly attach two substrates simultaneously and combine steps of processing multiple substrates simultaneously. For example, while the robot arm moves to the connecting device to take a treated substrate from the substrate holder, the touching gripper attached thereto can already carry another aligned (treated or untreated) substrate and replace the substrate contained in the substrate holder.

The inventive method as disclosed herein proved to be very useful for wafer-like substrates like a wafer. Herein, it was noted that the inventive method is especially useful to process wafers providing a frame like structure. The phrase "frame like structure" as used herein refers to a structure, wherein a thin inner part is surrounded by a thicker outer part: Preferably, the thicker outer part is located at the edge of the frame like structure to provide a stable frame resulting in a stabilisation of the wafer. Such wafers can be produced, for example, by abrading the inner part of the wafer leaving out the frame area of the wafer. An example of such "frame like structure" is the Taiko-Wafer.

The loading device typically is used to introduce the substrate into the apparatus and take the treated substrates out of the apparatus. Herein, it proved to be beneficial that the loading device comprises a cassette capable of storing at least one substrate. Using cassettes capable to contain one substrate is, for example, beneficial, if different types of substrates should be processed to evaluate their differences. However, typically it is preferred that the cassette is capable to contain a plurality of substrates like at least five, more preferred at least ten, substrates. Using such cassettes provides the benefit that a plurality of substrates can be introduced and automatically processed greatly reducing the amount of manual interaction required. It is further preferred to use different cassettes in such way that the untreated substrates are stored in one cassette while the treated substrates are stored in another cassette.

Using the inventive method surprisingly also allows to automatically process a plurality of wafers providing a frame like structure automatically. Typically, it is preferred that the inventive method is repeating at least two, more preferred at least five times, wherein multiple substrates stored in a loading device are processed.

The storing device can, for example, be a cassette being firmly attached or being removable, wherein said storing device can be used to temporarily collect at least one substrate. Such storing device can be used as initial point for a process after the inventive method. For example, the treated substrate can be subject to some following resist stripping process taking place in a different part of the inventive apparatus.

According to an especially preferred embodiment of the inventive method the treating of the substrate contains an electrolytic metal deposition like electrolytic copper or nickel deposition, and the post-treating of the substrate contains drying the substrate, more preferred rinsing and drying the substrate. It is assumed that the combination of exact placement of the substrate in the substrate holder to provide a clearly defined electrical contacting and the surprisingly greatly decreased chance of surface damages after such drying step as post-treating process are the main reasons resulting in the greatly improved quality of the treated substrate.

It was noted that the inventive method is especially suited to be used as clean room process. Herein, the high degree of automation essentially reducing the manual interaction to introducing the substrates to be processed and taking out the processed substrates seems to greatly decrease the risk of damages and contaminations. Herein, it is further typically preferred that the inventive method is carried out in an enclosed room representing a specific apparatus within such clean room. Using the inventive method it is possible to combine these steps with only a low amount of space required. According to another aspect the present invention refers to an apparatus for processing a wafer-like substrate, having a loading device, an alignment device, a connecting device, a treatment device, a post-treatment device, a storing device and a touching gripper and a touchless gripper, both are capable of transporting the substrate in such a way, that:

a touchless gripper or touching gripper capable of transporting the substrate from the loading device to the alignment device capable of aligning the substrate;

a touching gripper capable of transporting an aligned substrate from the alignment device to the connecting device capable of fastening the aligned substrate in a substrate holder and unfastening a treated substrate from a substrate holder;

a touching gripper capable of transporting the substrate holder from the connecting device to the treatment device capable of treating the substrate and back to the connecting device;

a touching gripper capable of transporting the treated substrate from the connecting device to the post-treatment device;

a touchless gripper capable of transporting the post-treated substrate from the post-treatment device to the storing device or back to the loading device.

Typically, it is further preferred that the apparatus contains the components as specified above with regard to the method.

Furthermore, it is preferred that the treatment device is for wet treatment, preferably a) chemical or electrolytic metal deposition, b) chemical or electrolytic etching and/or c) chemical or electrolytic cleaning, more preferably for electrolytic metal deposition, chemical etching and or chemical cleaning, more preferably for electrolytic metal deposition, chemical etching and or chemical cleaning. The inventive method proved to be especially useful for a treatment device for chemical or electrolytic metal deposition, more preferred electrolytic metal deposition. An especially preferred type of treatment device as used herein is a treatment device for electrolytic copper deposition, preferably a vertical treatment device for electrolytic copper deposition.

According to another aspect the present invention refers to an use of the inventive method or the inventive apparatus for processing a wafer-like substrate, wherein said wafer like substrate is a wafer providing a frame like structure. It was noted that the inventive method and apparatus are especially suited for handling such types of wafers.

Typically, it is preferred that the apparatus provides at least one opening to introduce a loading device, comprising a cassette providing at least one substrate, into the apparatus or to take the loading device out of the apparatus. Herein, said at least one opening is preferably manually operable. Especially when using a cassette as part of the loading device, wherein the cassette may provide a plurality of substrates such opening allows a simple and efficient introducing of substrates to be treated and removal of treated substrates.

It was noted that the inventive apparatus proved to be especially useful for vertical electroplating. Such process can be, for example, used to galvanically deposit metals like copper or nickel onto a surface of a semiconductor wafer.

The following non-limiting examples are provided to illustrate preferred embodiments of the present invention and to facilitate understanding of the invention, but are not intended to limit the scope of the invention, which is defined by the claims appended hereto.

FIG. 1 shows a schematic perspective view of a part of an inventive apparatus. Herein, the apparatus provides a loading device 1 comprising a cassette on the left containing multiple wafer-like substrates, wherein said wafer-like substrates are wafers providing a frame-like structure. These substrates are transported from the loading device 1 to the aligning device 2 using a touchless gripper 3 being a Bernoulli type gripper reversibly attached to the robot arm 7. Based on the size of the aligning device 2 the details of said device like the arms for holding and aligning the substrate are not shown in the Figure. The aligning device 2 aligns the substrate providing an exactly aligned substrate before it is transported to the connecting device 5 using a touching gripper. Herein, the touching gripper is a vacuum suction gripper reversibly attached to the robot arm 7. Said substrate is fastened to a substrate holder being not shown in the Figure provided by the substrate holder.

Thereafter, the substrate holder is transported to the treatment device being not shown in the Figure using a touching gripper. After treating the substrate including electrolytic metal deposition on both sides of the substrate the substrate holder containing the substrate is transported to the connecting device 5. Here, the substrate is unfastened from the substrate holder.

The unfastened and treated substrate is transported to the post-treatment device 6 using a touching gripper being a vacuum suction gripper reversibly attached to the robot arm 7. In the post-treating device 6 the post-treating takes place including drying the substrate. Thereafter, the substrate is transported to the loading device 1 using a touchless gripper 3 being a Bernoulli gripper reversibly attached to the robot arm 7.

Figure 2:
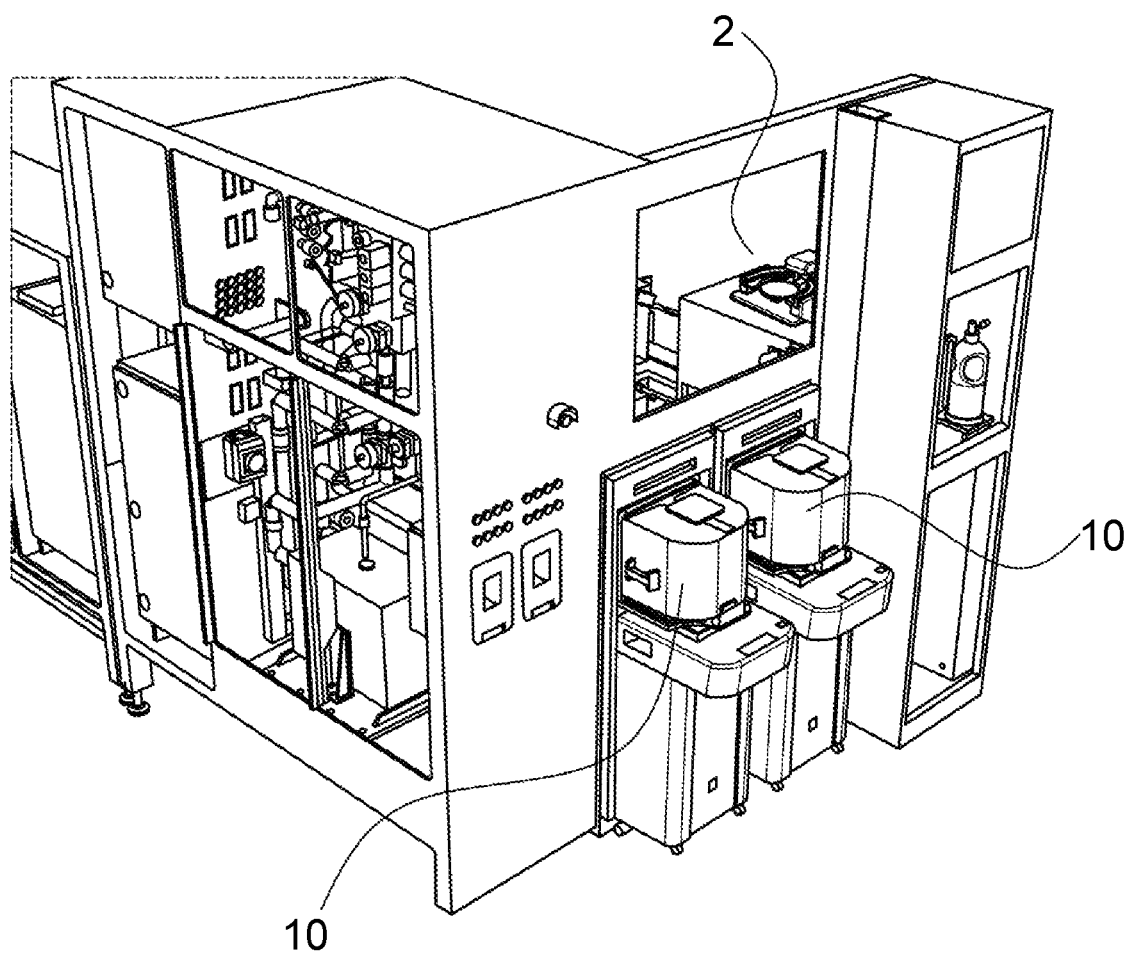
FIG. 2 shows a schematic side view of a part of the inventive apparatus as shown in FIG. 1.

FIG. 2 shows a schematic side view of a part of the inventive apparatus as shown in FIG. 1. Herein, the side view shows the covers 10 of the openings to introduce a loading device comprising a cassette providing the substrates.

Figure 3:
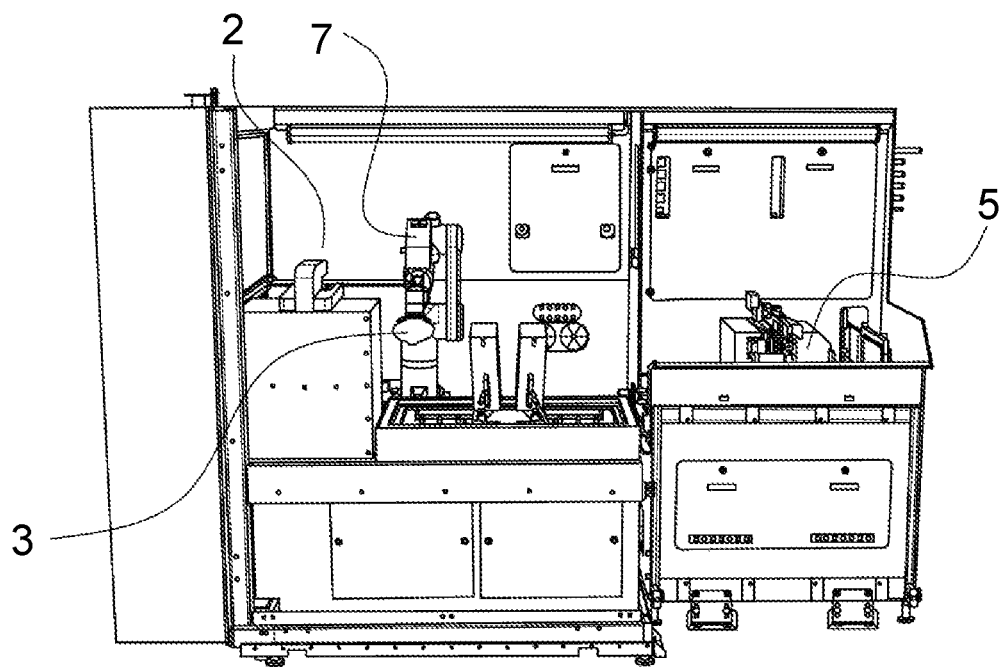
FIG. 3 shows a schematic front view of a part of the inventive apparatus as shown in FIG. 1.
Figure 4:
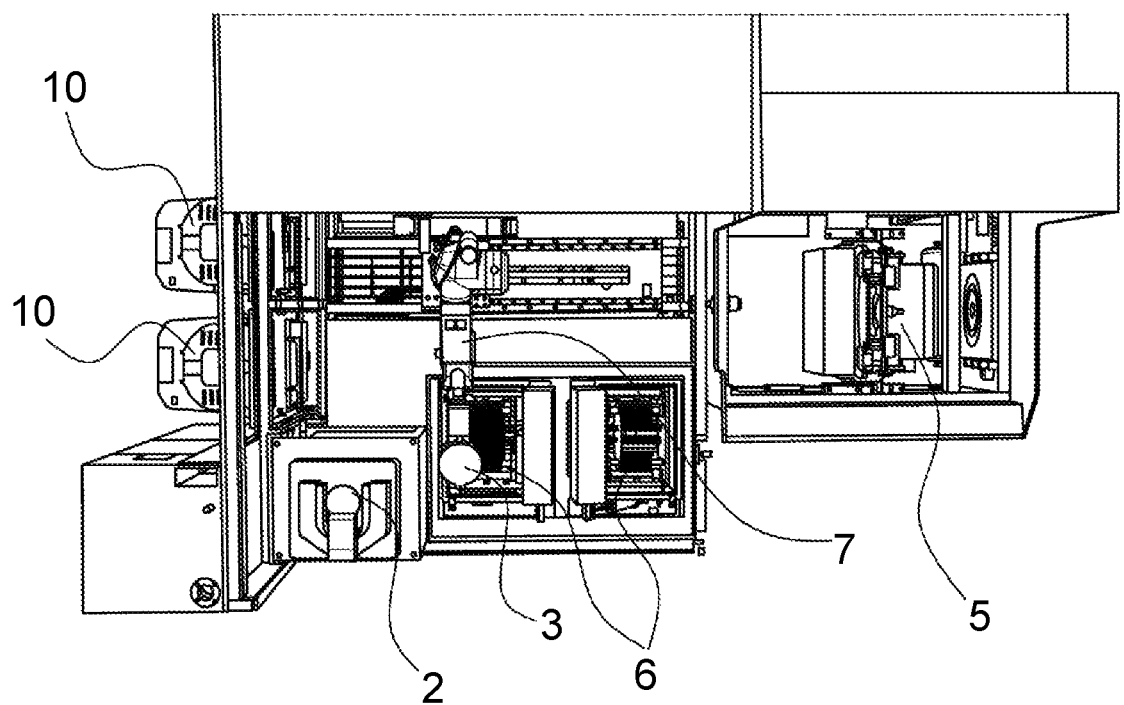
FIG. 4 shows a schematic top view of a part of the inventive apparatus as shown in FIG. 1.

FIG. 3 shows a schematic front view and FIG. 4 a schematic top view of a part of the inventive apparatus as shown in FIG. 1.

Figure 5:
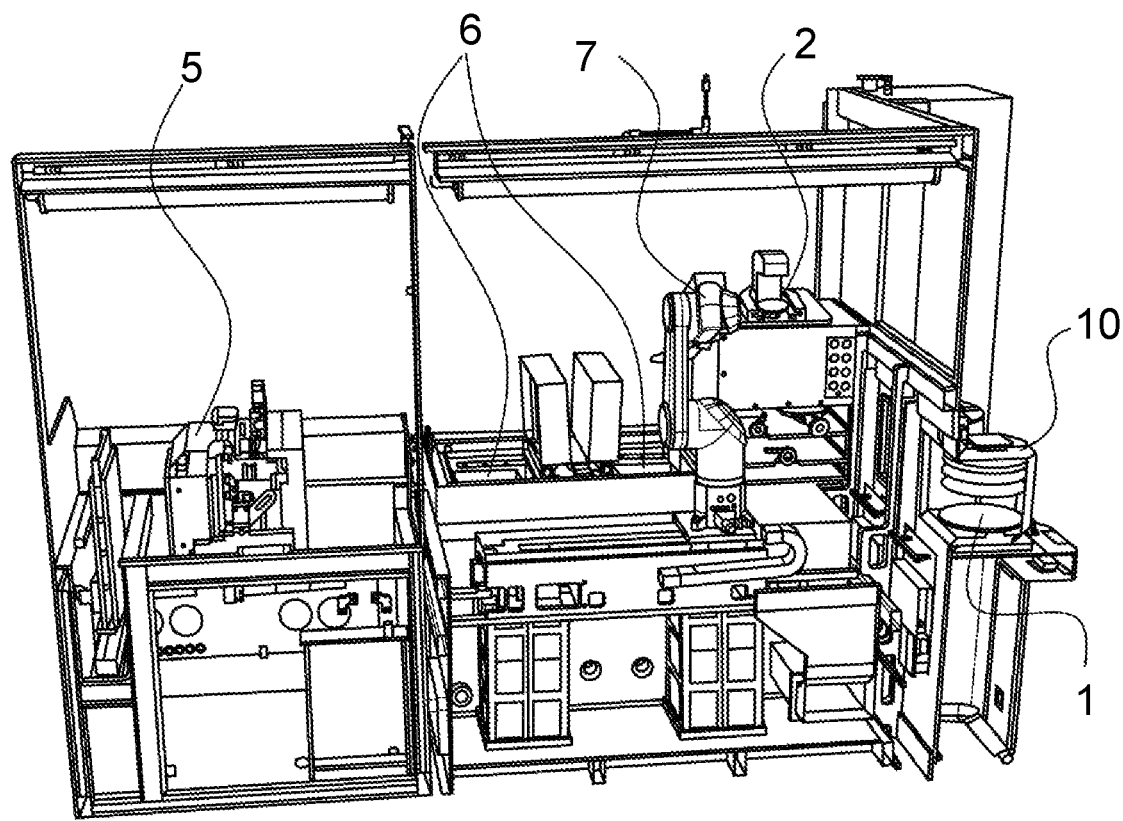
FIG. 5 shows a schematic cross section from the back side of a part of the inventive apparatus as shown in FIG. 1.

FIG. 5 shows a schematic cross section from the back side of a part of the inventive apparatus as shown in FIG. 1. Herein, the cover 10 of the opening containing the loading device 1 comprising the cassette is shown. Furthermore, the backside of the robot arm 7 to transport, for example, the substrate from the aligning device 2 to the connecting device 5 is shown.

Figure 6:
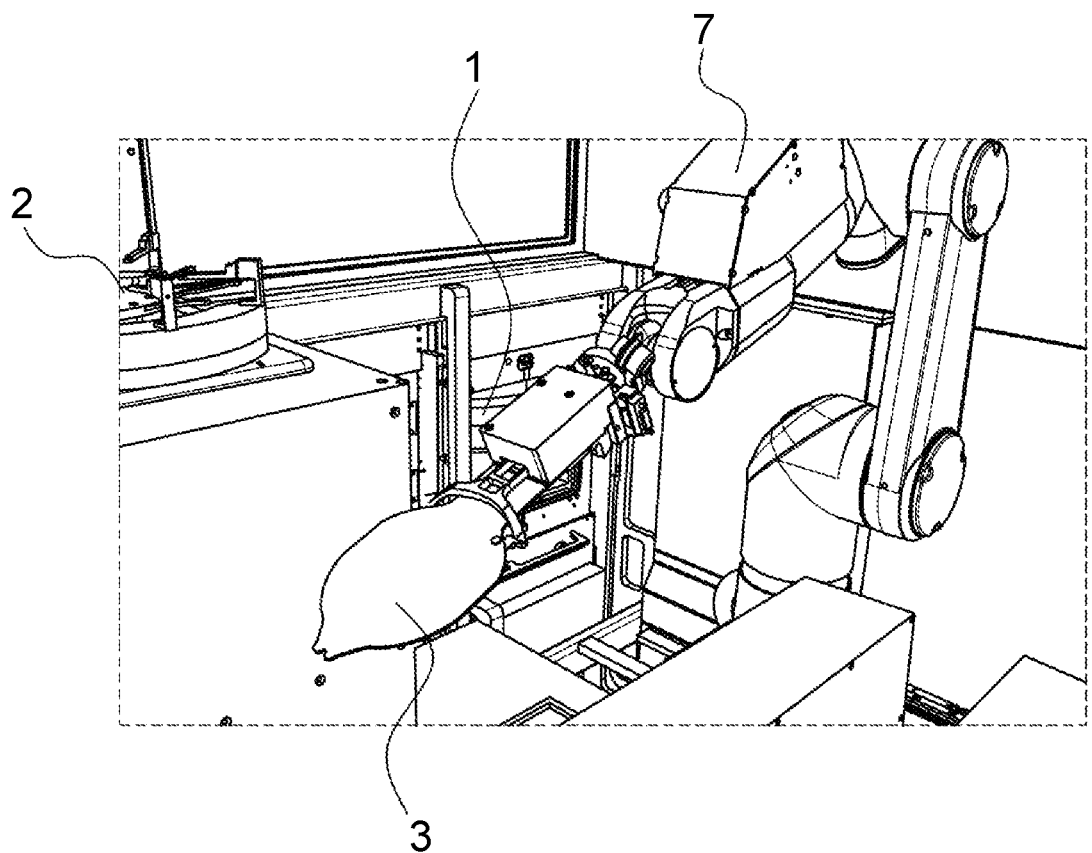
FIG. 6 shows a cutout of a schematic perspective view of the inventive apparatus as shown in FIG. 1.

FIG. 6 shows a detail of a schematic perspective view of the inventive apparatus as shown in FIG. 1. Herein, a part of the robot arm 7 is shown, wherein a touchless gripper 3 is reversibly attached thereto. On the left side a part of the aligning device 2 is shown wherein a part of the arms for holding and aligning the substrate are visible.

Figure 7:
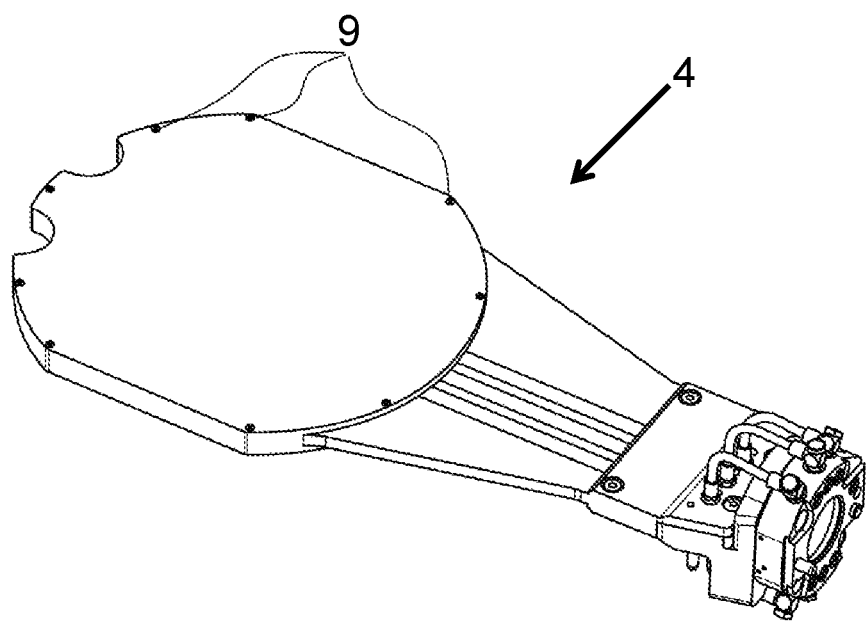
FIG. 7 shows a schematic perspective view of a touching gripper 4 capable of transporting a substrate while contacting the surface of the substrate as used in the inventive apparatus as shown in FIG. 1.

FIG. 7 shows a schematic perspective view of a touching gripper 4 capable of transporting a substrate while contacting the surface of the substrate as used in the inventive apparatus as shown in FIG. 1. Herein, three of the eight nozzles 9 included in the touching gripper 4 are labelled. Said nozzles 9 provide elevations of the surface of the touching gripper 4 to minimize the contact area of the touching gripper 4 on the surface of the substrate.

Figure 8:
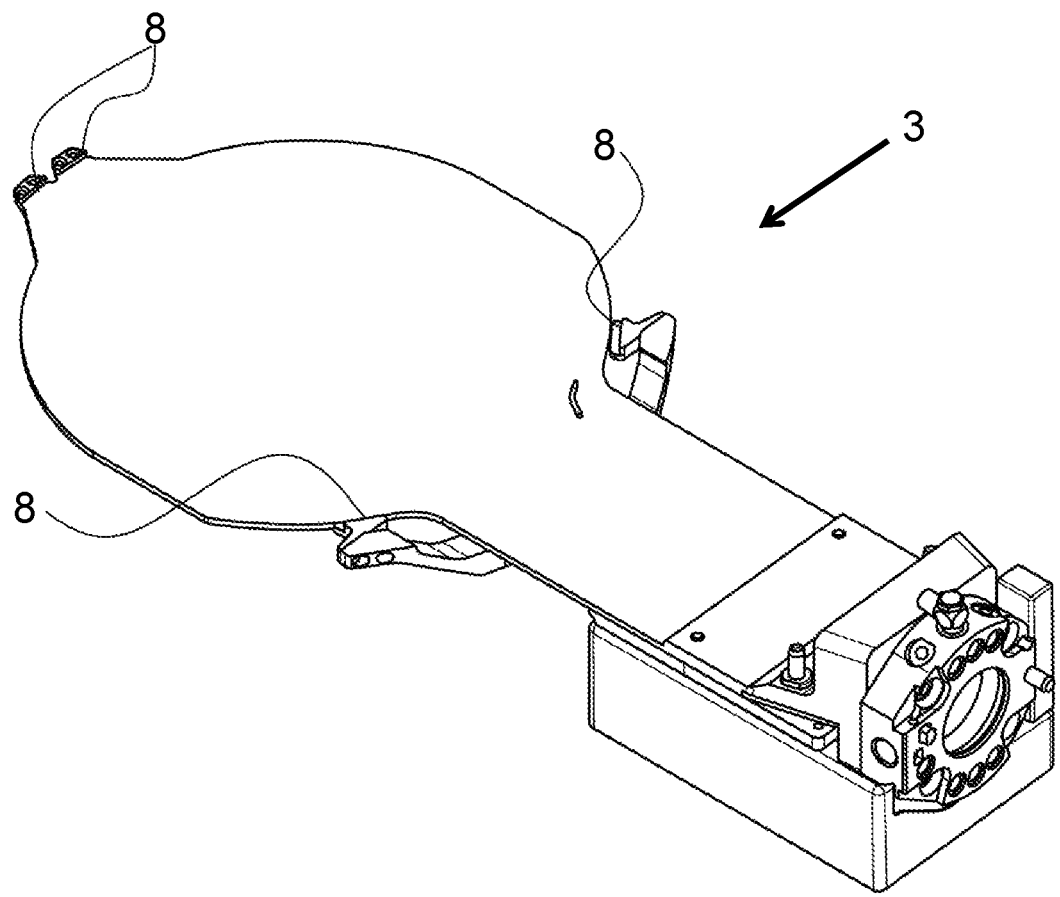
FIG. 8 shows a schematic perspective view of a touchless gripper 3 as used in the inventive apparatus as shown in FIG. 1.

FIG. 8 shows a schematic perspective view of a touchless gripper 3 as used in the inventive apparatus as shown in FIG. 1. Herein, the opening to provide the Bernoulli effect located in the middle of the touchless gripper 3 is not shown in the Figure. The plane center area of the touchless gripper 3 is surrounded by four limiting edges 9 to prevent the substrate from leaving the center of the touchless gripper 3.

REFERENCE SIGNS

1: loading device
2: alignment device
3: touchless gripper
4: touching gripper
5: connecting device
6: post-treatment device
7: robot arm
8: limiting edge
9: nozzle
10: cover of the opening to introduce a loading device

The invention claimed is:

1. A wafer substrate processing apparatus comprising a loading device, an alignment device, a connecting device, a treatment device, a post-treatment device, a storing device, and a robot arm having a touching gripper and a touchless gripper, both the touching gripper and the touchless gripper are capable of transporting a wafer substrate, wherein:

the touchless gripper or the touching gripper are capable of transporting the wafer substrate from the loading device to the alignment device, which is capable of aligning the wafer substrate;

the touching gripper is capable of transporting an aligned wafer substrate from the alignment device to the connecting device, which is capable of fastening the aligned wafer substrate in a substrate holder and unfastening a treated wafer substrate from the substrate holder;

the touching gripper is capable of transporting the substrate holder from the connecting device to the treatment device, which is capable of treating the wafer substrate, and back to the connecting device;

the touching gripper is capable of transporting the treated wafer substrate from the connecting device to the post-treatment device; and the touchless gripper is capable of transporting the post-treated wafer substrate from the post-treatment device to the storing device or back to the loading device.

2. The wafer substrate processing apparatus according to claim 1, wherein the treatment device is for wet treatment, wherein the wafer substrate is treated by one or more of a) chemical or electrolytic metal deposition, b) chemical or electrolytic etching and c) chemical or electrolytic cleaning.

3. The wafer substrate processing apparatus according to claim 1, wherein the wafer substrate comprises at least one surface to be treated and the touching gripper or the touchless gripper is capable to grip the wafer substrate on the at least one surface to be treated during transport.

4. The wafer substrate processing apparatus according to claim 1, wherein the touchless gripper is a Bernoulli gripper.

5. The wafer substrate processing apparatus according to claim 1, wherein the touching gripper and the touchless gripper are reversibly attached to the robot arm.

* * * * *